(12) United States Patent
Hazama et al.

(10) Patent No.: US 7,238,975 B2
(45) Date of Patent: Jul. 3, 2007

(54) NONVOLATILE SEMICONDUCTOR MEMORY DEVICE AND MANUFACTURING METHOD THEREFOR

(75) Inventors: Hiroaki Hazama, Hachioji (JP); Seiichi Mori, Tokyo (JP); Hirohisa Iizuka, Yokkaichi (JP); Norio Ootani, Yokkaichi (JP); Kazuhito Narita, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/860,014

(22) Filed: Jun. 4, 2004

(65) Prior Publication Data
US 2005/0012142 A1 Jan. 20, 2005

(30) Foreign Application Priority Data
Jun. 6, 2003 (JP) ............................. 2003-162019

(51) Int. Cl.
*H01L 21/8238* (2006.01)
(52) U.S. Cl. ...................... 257/239; 257/204; 257/288; 257/315
(58) Field of Classification Search ................ 257/204, 257/239, 288, 314, 315, E29.129, E29.3
See application file for complete search history.

(56) References Cited

U.S. PATENT DOCUMENTS

| | | | | |
|---|---|---|---|---|
| 5,104,819 A | * | 4/1992 | Freiberger et al. | 438/593 |
| 5,446,299 A | * | 8/1995 | Acovic et al. | 257/316 |
| 5,506,159 A | * | 4/1996 | Enomoto | 438/258 |
| 5,639,679 A | | 6/1997 | Muramatsu | |
| 6,144,062 A | | 11/2000 | Mine et al. | |
| 6,555,427 B1 | | 4/2003 | Shimizu et al. | |
| 6,570,216 B1 | * | 5/2003 | Rolandi | 257/326 |
| 6,943,074 B2 | | 9/2005 | Kamiya et al. | |
| 2005/0184327 A1 | * | 8/2005 | Ozawa | 257/302 |

FOREIGN PATENT DOCUMENTS

| | | |
|---|---|---|
| JP | 7-115144 | 5/1995 |
| JP | 9-36263 | 2/1997 |

OTHER PUBLICATIONS

Toshitake Yaegashi et al., "Anomalous Diffusion of Dopant in Si Substrate during Oxynitride Process," IEDM Tech. Dig. (1999), pp. 341-344.
F. Arai et al., "High-Density ($4.4F^2$) NAND Flash Technology Using Super-Shallow Channel Profile (SSCP) Engineering," IEDM Tech. Dig. (2000), pp. 775-778.

* cited by examiner

*Primary Examiner*—George Fourson
*Assistant Examiner*—Joannie Adelle Garcia
(74) *Attorney, Agent, or Firm*—Finnegan, Henderson, Farabow, Garrett & Dunner, L.L.P.

(57) ABSTRACT

A nonvolatile semiconductor memory device including at least one MOS transistor in a peripheral circuit comprises a semiconductor substrate, isolation insulating films for defining a plurality of element formation regions, each of the isolation insulating films being buried in an isolation trench provided in the semiconductor substrate, a floating gate provided in each of the element formation regions via a first gate insulating film, a control gate provided on the floating gate via a second gate insulating film, and source and drain regions provided in the semiconductor substrate in self-alignment with the control gate, wherein the floating gate is self-aligned at an isolation end in a direction of a channel width, and comprises a plurality of polysilicon films.

10 Claims, 11 Drawing Sheets

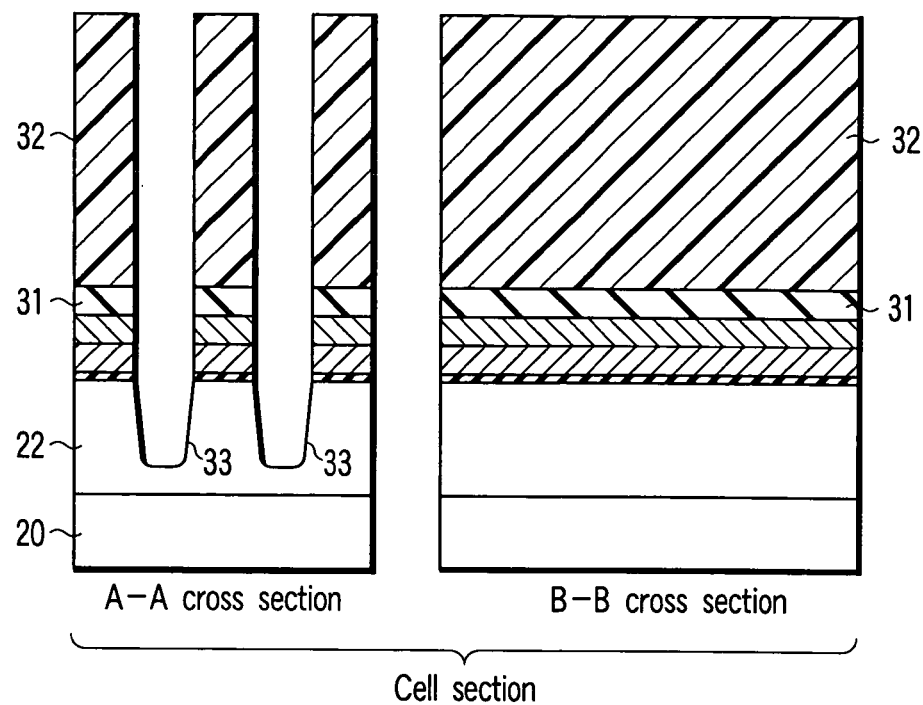
F I G. 6A
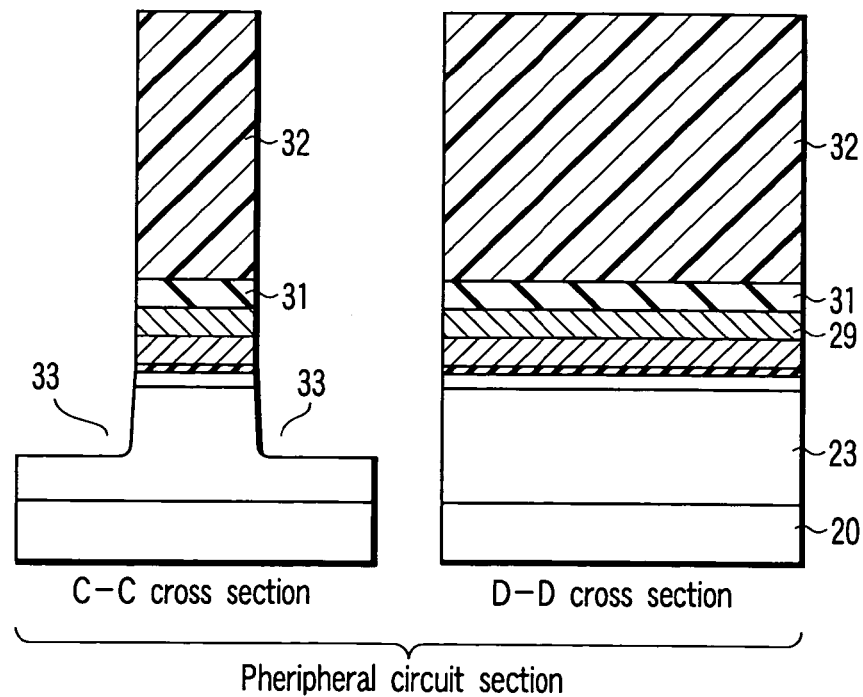
F I G. 6B

A—A cross section · B—B cross section

Cell section

C—C cross section · D—D cross section

Pheripheral circuit section

A-A cross section   B-B cross section

Cell section

C-C cross section   D-D cross section

Pheripheral circuit section

NONVOLATILE SEMICONDUCTOR MEMORY DEVICE AND MANUFACTURING METHOD THEREFOR

CROSS-REFERENCE TO RELATED APPLICATIONS

This application is based upon and claims the benefit of priority from the prior Japanese Patent Application No. 2003-162019, filed Jun. 6, 2003, the entire contents of which are incorporated herein by reference.

BACKGROUND OF THE INVENTION

1. Field of the Invention

The present invention relates to a nonvolatile semiconductor memory device including at least one MOS transistor in a peripheral circuit, and a manufacturing method therefor.

2. Description of the Related Art

In order to increase the reliability of the tunnel insulating film of a nonvolatile semiconductor memory device, i.e., each of nonvolatile memory cells, an oxynitride film is used as the tunnel insulating film.

Formation of a high-quality oxynitride film requires annealing in an oxygen atmosphere after an oxide film is nitrided. However, it is reported in "Yaegashi et al., IEDM Tech. Dig., pp. 341–344, 1999" that when annealing in the oxygen atmosphere after nitriding is carried out, an impurity, particularly, boron in a silicon substrate is abnormally diffused.

In general, ion implantation into a channel of a MOS transistor is executed before a gate oxide film is formed. Thereafter, the gate oxide film is produced, and a gate electrode is provided on it.

If nitriding of an oxide film and subsequent annealing in the oxygen atmosphere are performed in the step of forming the gate insulating film, anomalous diffusion of the implanted channel impurity will be caused.

On the other hand, demands have arisen for attaining a shallow channel impurity profile as well as a fine device structure of the MOS transistor. If anomalous diffusion of impurity ions occurs after channel ion implantation, the shallow channel impurity profile cannot be controlled, failing to reduce the fine device structure of the transistor.

In order to improve the controllability of the channel impurity profile of the channel, a device process of implanting ions via a gate polysilicon electrode after forming the oxide film and gate electrode of a MOS transistor is proposed in "Arai et al., IEDM Tech. Dig., pp. 775–778, 2000". According to this process, after a gate oxide film and a first gate electrode film are formed, a trench is formed in a semiconductor substrate by STI (Shallow Trench Isolation), and an oxide film is filled in the trench. Thereafter, channel ion implantation is done via the first gate electrode film, and a second gate electrode film is deposited on the first gate electrode film.

However, a process of depositing the second gate electrode film after filling the oxide film in the trench by STI is becoming unavailable with the fine device structure.

In order to miniaturize the nonvolatile memory cell, a floating gate electrode and the end of an isolation region in the direction of channel width must be self-aligned. In a device in which the floating gate electrode of the nonvolatile memory cell and the end of the isolation region in the direction of channel width are self-aligned, the floating gate electrode must be produced before the isolation region is formed by STI. The floating gate electrode must be formed as thick as, e.g., 1,500 Å or more in order to ensure a sufficiently large surface area of an ONO insulating film interposed between the floating gate electrode and a control gate electrode.

For such thick floating gate electrode, even if the channel ion implantation is done after formation of the isolation region by STI as the prior art, ions must be implanted at an acceleration voltage enough to pass through the thick floating gate electrode made of polysilicon. It is difficult to control the channel impurity profile shallowly.

As described above, the shallow channel impurity profile must be obtained in addition to the fine device structure of the nonvolatile memory cell or MOS transistor. If impurity ions anomalously diffuse after the channel ion implantation, the channel impurity profile cannot be controlled shallowly, and the fine device structure of the MOS transistor cannot be attained.

In the case of the thick floating gate electrode of the memory cell, even if the channel ion implantation is done after formation of the isolation region by STI, like the prior art, ions must be implanted at an acceleration voltage enough to pass through the thick floating gate electrode of the polysilicon. It is then difficult to control the channel impurity profile shallowly.

As the memory cell integration degree increases, the isolation width decreases. In the prior art, the floating gate electrode of the memory cell is divided by a slit pattern on an isolation layer, and an interpoly insulating film and control gate electrode are formed between the divided electrodes. However, as the isolation layer becomes narrower, it becomes more difficult to form a slit pattern on the isolation layer. The floating gate electrode must be formed in self-alignment with the element active region (AA region).

BRIEF SUMMARY OF THE INVENTION

According to the first aspect of the present invention, a nonvolatile semiconductor memory device including at least one MOS transistor in a peripheral circuit comprises a semiconductor substrate, isolation insulating films for defining a plurality of element formation regions, each of the isolation insulating films being buried in an isolation trench provided in the semiconductor substrate; a floating gate provided in each of the element formation regions via a first gate insulating film; a control gate provided on the floating gate via a second gate insulating film; and source and drain regions provided in the semiconductor substrate in self-alignment with the control gate, wherein the floating gate is self-aligned at an isolation end in a direction of a channel width, and comprises a plurality of polysilicon films.

According to the second aspect of the present invention, a method of manufacturing a nonvolatile semiconductor memory device including at least one MOS transistor in a peripheral circuit comprises forming a first well for a memory cell and a second well for the MOS transistor in a semiconductor substrate; forming a tunnel insulating film and a gate insulating film on a substrate surface including the first and second wells; depositing a first polysilicon film on the substrate surface; covering the first well with a resist mask to carry out ion implantation into the second well, thereby forming a channel region therein; after removing the resist mask from the first well, depositing a second polysilicon film on the first polysilicon film; forming a silicon nitride film on the second polysilicon film; forming on the silicon nitride film a resist pattern having openings for isolation regions; sequentially selectively removing the film structure from the silicon nitride film to the first and second wells by using the resist pattern to provide isolation trenches in the first and second wells; after removing the resist pattern, burying an oxide film in the isolation trenches; after planarizing the substrate surface, removing the silicon nitride film; forming an ONO stacked film on the substrate surface; forming a resist mask on the first well to selectively remove the ONO stacked film from the second well; depositing at least a conductive film on the substrate surface; sequentially selectively removing the conductive film, the ONO stacked film, the second polysilicon film, and the first polysilicon film to expose the tunnel insulting film on the first well and the gate oxide film on the second well; and introducing an impurity into the first and second wells to provide source and drain regions.

BRIEF DESCRIPTION OF THE DRAWINGS

FIGS. 2A and 2B to FIGS. 14A and 14B are sectional views schematically showing a memory cell section A and peripheral circuit section B in a series of manufacturing processes of the nonvolatile semiconductor memory device according to the embodiment.

DETAILED DESCRIPTION OF THE EMBODIMENT

Figure 1A:
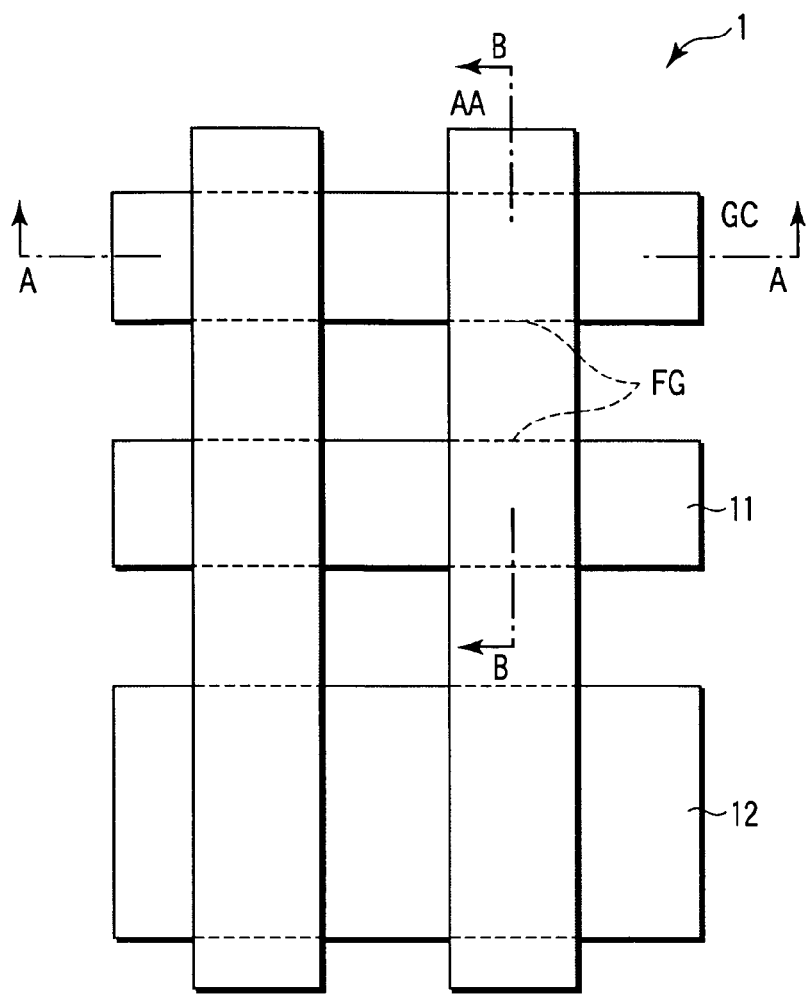
FIGS. 1A and 1B are plan views, respectively, showing a memory cell section and peripheral circuit section in a nonvolatile semiconductor memory device according to an embodiment of the present invention.
Figure 1B:
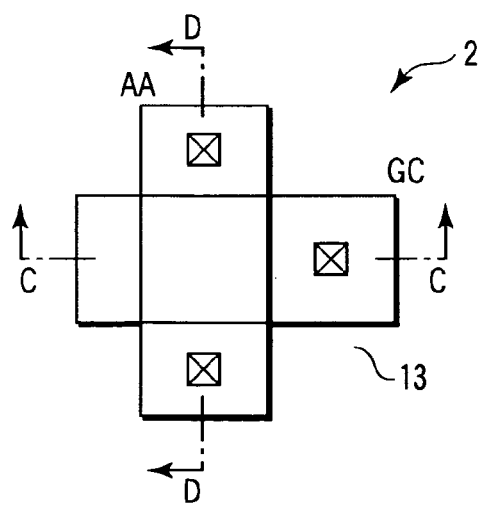

An embodiment of the present invention will be described below with reference to the several views of the accompanying drawing. FIGS. 1A and 1B are plan views, respectively, showing a memory cell array section 1 and peripheral circuit section 2 in a nonvolatile semiconductor memory device.

The memory cell section 1 has a memory cell 11 and selection gate transistor 12. The peripheral circuit section 2 has a MOS transistor 13. In this case, the peripheral circuit section 2 can further includes low voltage n- and p-channel MOS transistors, high voltage (high breakdown voltage) n-channel MOS transistors and the like.

The steps of forming an n-channel memory cell as the memory cell 11 and a p-channel MOS transistor as the MOS transistor 13 of the peripheral circuit section 2 will be explained with reference to the A—A, B—B, C—C, and D—D cross sections in FIGS. 1A and 1B. In the following views, "A" means the A—A and B—B cross sections of the memory cell section, and "B" means the C—C and D—D cross sections of the peripheral circuit section.

Figure 2A:
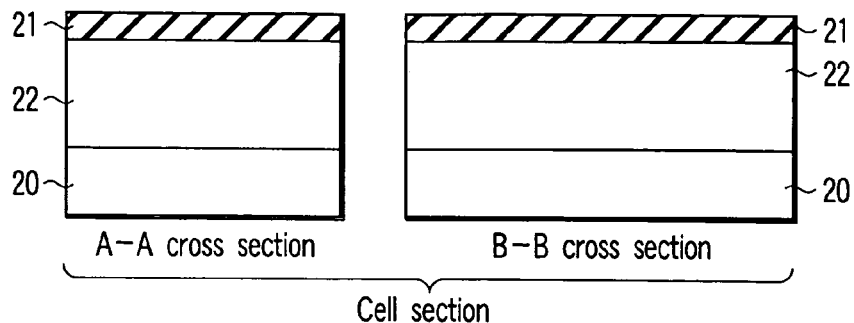
Figure 2B:
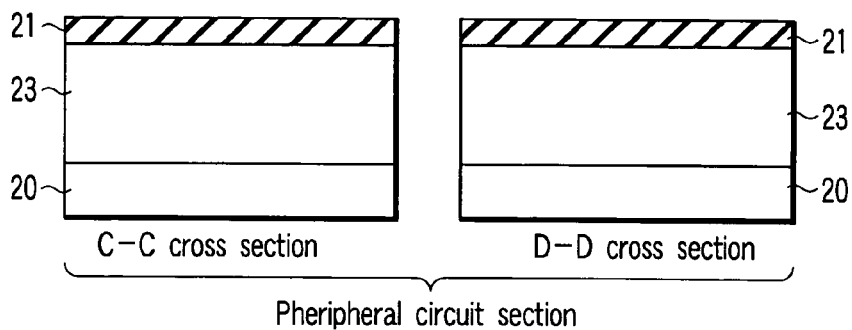

As shown in FIGS. 2A and 2B, the surface of the silicon substrate 20 is thermally oxidized to form an oxide film 21 to a thickness of, e.g., 100 nm. Desired ions are implanted into the cell section 1 and peripheral circuit section 2 by a predetermined dose, using a general photoresist process. The silicon substrate 20 is heat-treated to form a p-well 22 (first well) and n-well 23 (second well) in the cell section 1 and peripheral circuit section 2, respectively. Thereafter, the oxide film 21 formed on the substrate surface is removed with a fluoric acid solution.

Figure 3A:
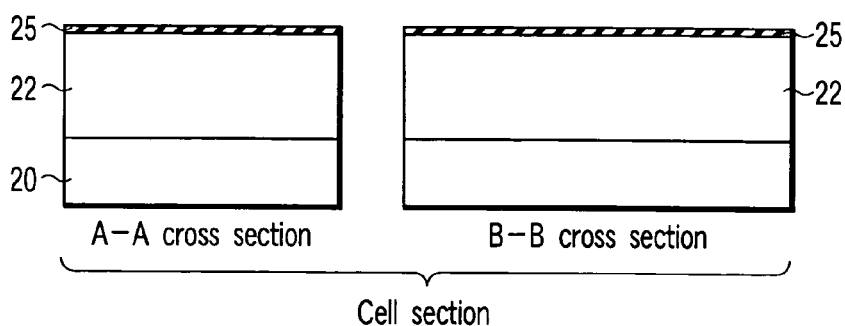
Figure 3B:
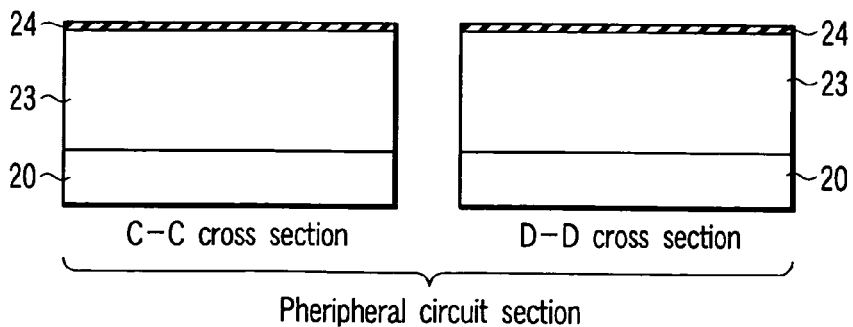

As shown in FIGS. 3A and 3B, the silicon substrate 20 is annealed in an oxygen atmosphere to form a gate oxide film 24 of a p-channel MOS transistor in the peripheral circuit section 2 to a thickness of, e.g., 40 nm. The gate oxide film 24 is selectively removed from the substrate surface of the cell section 1 with a fluoric acid solution, using the general photoresist process. The exposed substrate surface is thermally oxidized to form a tunnel insulting film 25 of a memory cell to a thickness of, e.g., 7 nm. The tunnel insulting film 25 is heat-treated in an $NH_3$ atmosphere to introduce nitrogen thereinto. At this time, hydrogen is also introduced from $NH_3$ gas into the tunnel insulting film 25. In order to eliminate hydrogen, the silicon substrate 20 is annealed in the oxygen atmosphere again to form an oxynitride tunnel insulting film 25 which contains nitrogen in the oxide film.

Figure 4A:
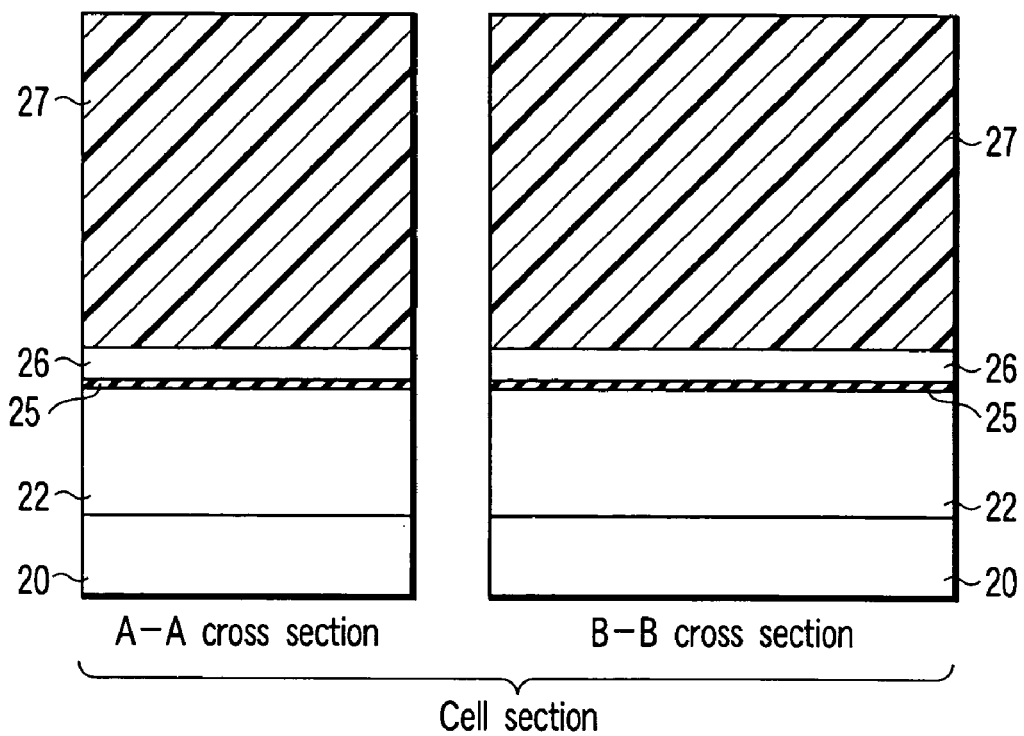
Figure 4B:
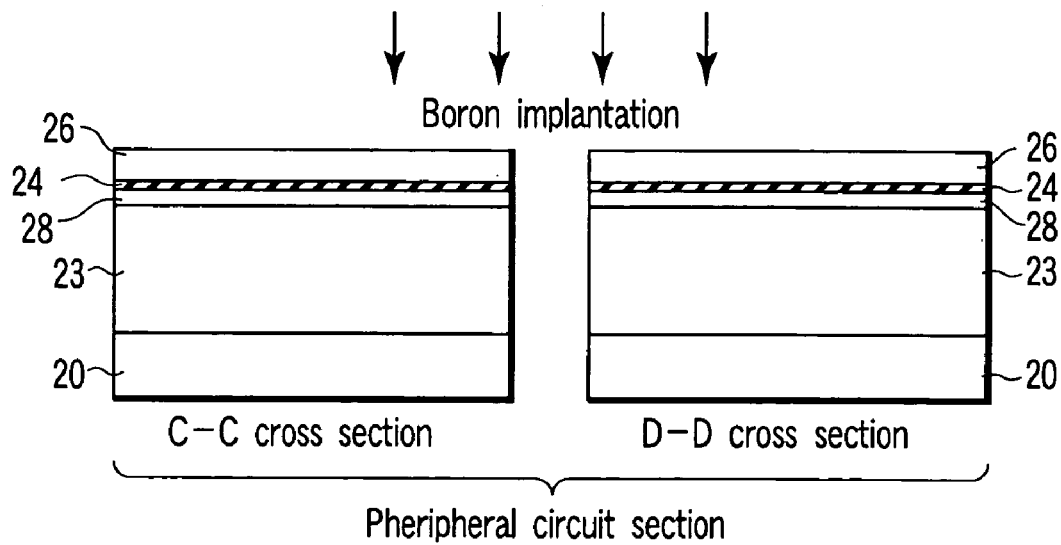

As shown in FIGS. 4A and 4B, an undoped polysilicon film 26 serving as part of a gate electrode is deposited to a thickness of, e.g., 40 nm by general LP-CVD on the gate oxide film 24 and tunnel insulting film 25 which are formed on the silicon substrate 20.

A resist pattern 27 is formed on the undoped polysilicon film 26 of the memory cell, and boron ions are implanted into the undoped polysilicon film 26 of the p-channel MOS transistor at, e.g., an acceleration voltage of 40 KeV and a dose of $4\times10^{12}$ $cm^{-2}$. By this ion implantation, boron passes through the undoped polysilicon film 26 and gate oxide film 24 to form a thin p-type region 28, i.e., channel region in the n-well 23.

Channel ion implantation to the n-MOS transistor of the peripheral circuit and ion implantation to a high-breakdown-voltage transistor using a proper resist pattern can also be executed.

Figure 5A:
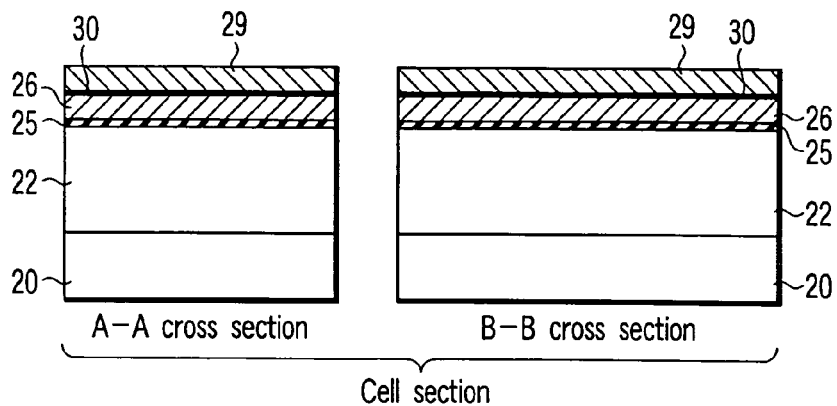
Figure 5B:
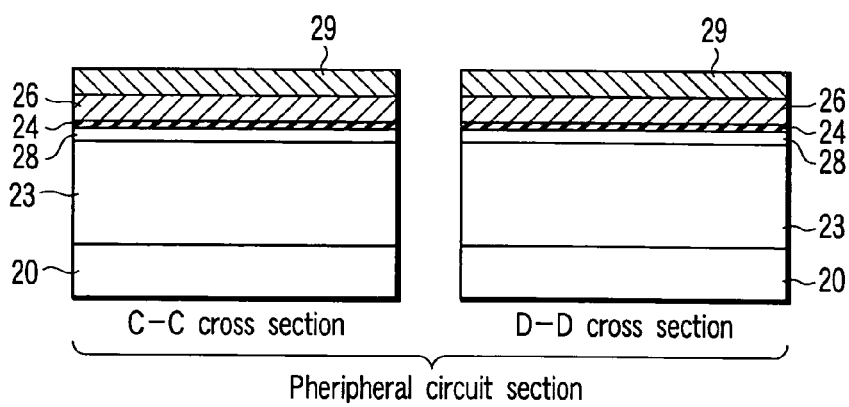

The resist pattern 27 is removed by general resist ashing, and cleaning processing is performed. As shown in FIGS. 5A and 5B, a second phosphorous-doped polysilicon film 29 serving as part of the gate electrode is formed to a thickness of, e.g., 125 nm on the undoped polysilicon film 26 in an LP-CVD chamber. The second polysilicon film 29 can adopt a stacked structure composed of an undoped polysilicon film, doped polysilicon film, and undoped polysilicon film.

At this time, an oxide film 30 having a thickness of 1 to 2 nm is produced between the first undoped polysilicon film 26 and the second phosphorous-doped polysilicon film 29. The oxide film 30 is formed on the surface of the first polysilicon film 26 in cleaning processing or loading the semiconductor substrate into the LP-CVD chamber. Since the oxide film 30 is externally thin and a native oxide film, holes are partially formed therein when polysilicon crystal grains grow in a subsequent thermal process. As a result, the first and second polysilicon films are connected, and phosphorous diffuses from the second polysilicon film 29 to the first polysilicon film 26.

The thin oxide film 30 between the first polysilicon film 26 and the second polysilicon film 29 may substantially disappear depending on the subsequent thermal process owing to the crystal grain growth. At least grain boundaries appear between the first polysilicon film 26 and the second polysilicon film 29.

The first polysilicon film 26 is undoped, whereas phosphorous is doped in the second polysilicon film 29. However, undoped polysilicon is used as the second polysilicon film and an impurity may be introduced thereinto by ion implantation in a subsequent process. Further, an impurity-doped polysilicon film may be used as the first and second polysilicon films.

As shown in FIGS. 6A and 6B, a silicon nitride film 31 is deposited to a thickness of 100 nm on the second polysilicon film 29. A resist material is applied to the silicon nitride film 31 to form a resist pattern 32 having openings for the isolation regions by a photolithography technique. Using the resist pattern 32 as a mask, the films from the silicon nitride film 31 to the p-well 22 and n-well 23 are sequentially selectively removed by RIE so as to etch the p-well 22 and n-well 23 by about 200 nm, thereby forming isolation trenches 33 in the p-well 22 and n-well 23, respectively.

At this time, the first and second polysilicon films 26 and 29, which provide the floating gate electrode in the memory cell section, and the isolation trenches 33 are removed by reactive ion etching using the same mask. For this reason, the floating gate electrode of each memory cell, the gate electrode of the MOS transistor, and the isolation end are self-aligned at the active region end (AA end), i.e., the isolation end in the direction of channel width.

When the inner trench wall is subjected to oxidation processing (to be described later), at least the silicon substrate does not extend externally because polysilicon has generally higher oxidation rate than silicon.

Figure 7A:
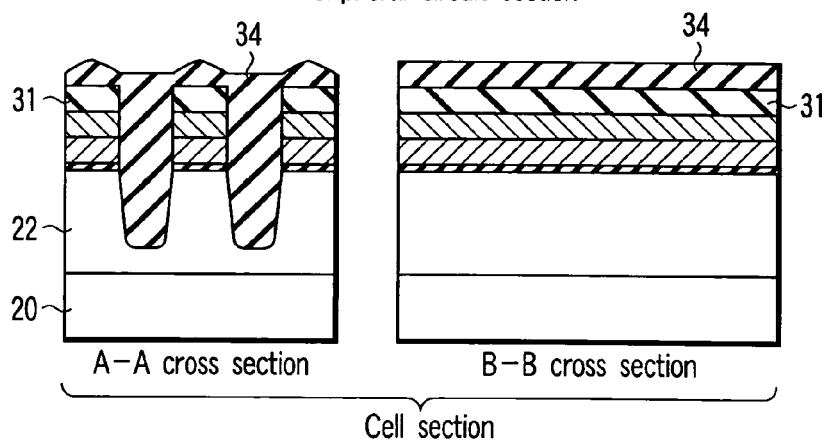
Figure 7B:
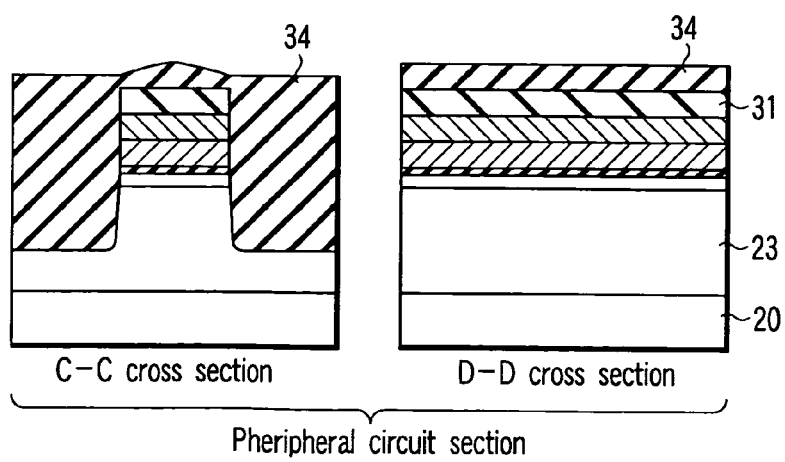

As shown in FIGS. 7A and 7B, the resist pattern 32 is removed by resist ashing, and a silicon oxide film 34 is embedded in the isolation trenches 33. Each of the element isolation trenches 33 has a fine pattern, and further has a large aspect ratio thereof. Thus, for embedding the oxide film 34, an embedding method with a good embedding characteristic, such as HDP (High Density Plasma) method is used.

If necessary in terms of the element characteristic, the inner wall of each isolation trench 33 may be thermally oxidized in the oxygen atmosphere before an oxide film such as an HDP film is embedded.

Figure 8A:
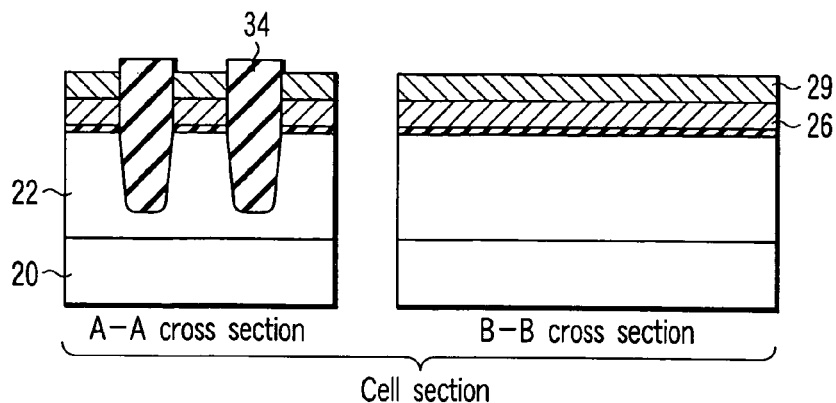
Figure 8B:
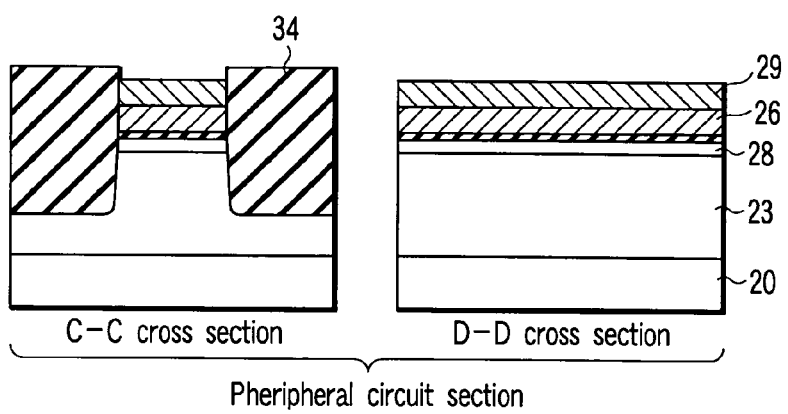

As shown in FIGS. 8A and 8B, the substrate surface is planarized by CMP using the silicon nitride film 31 as a stopper. At the end of planarization, the silicon nitride film 31 is removed by hot phosphoric acid.

Figure 9A:
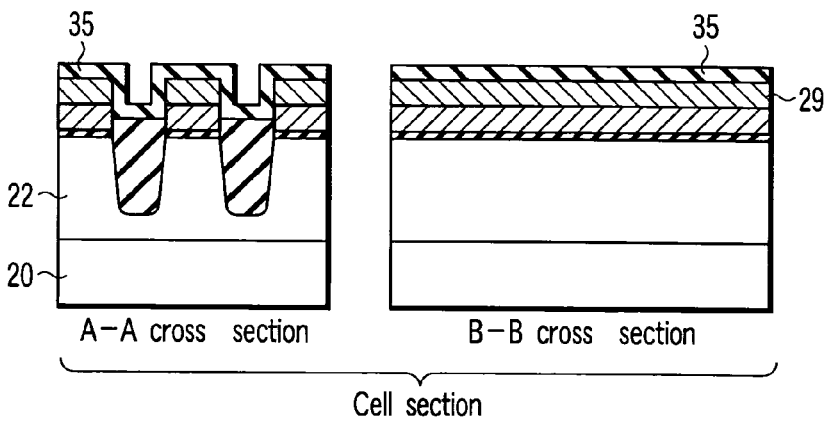
Figure 9B:
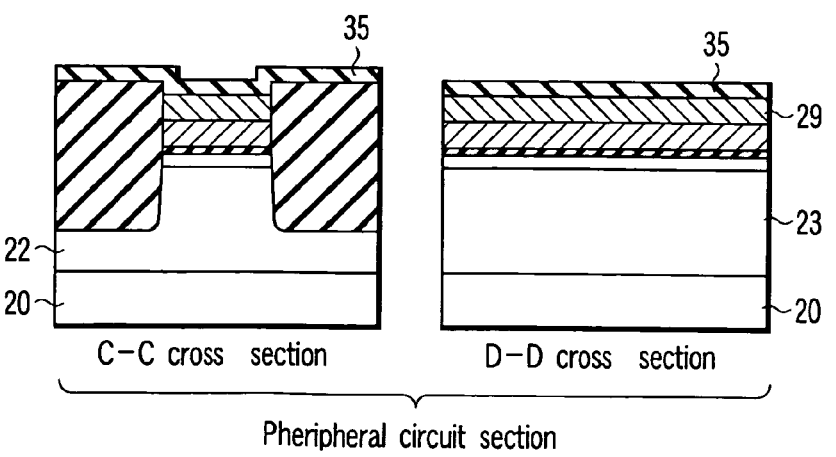

As shown in FIGS. 9A and 9B, the structure except the memory cell section is covered with a resist material, and the oxide film 34 embedded in each isolation trench 33 is etched by 100 nm by RIE. An ONO stacked film 35 (stacked structure of a silicon oxide film (O)/silicon nitride film (N)/silicon oxide film (O)) is formed as an interpoly insulating film.

Figure 10A:
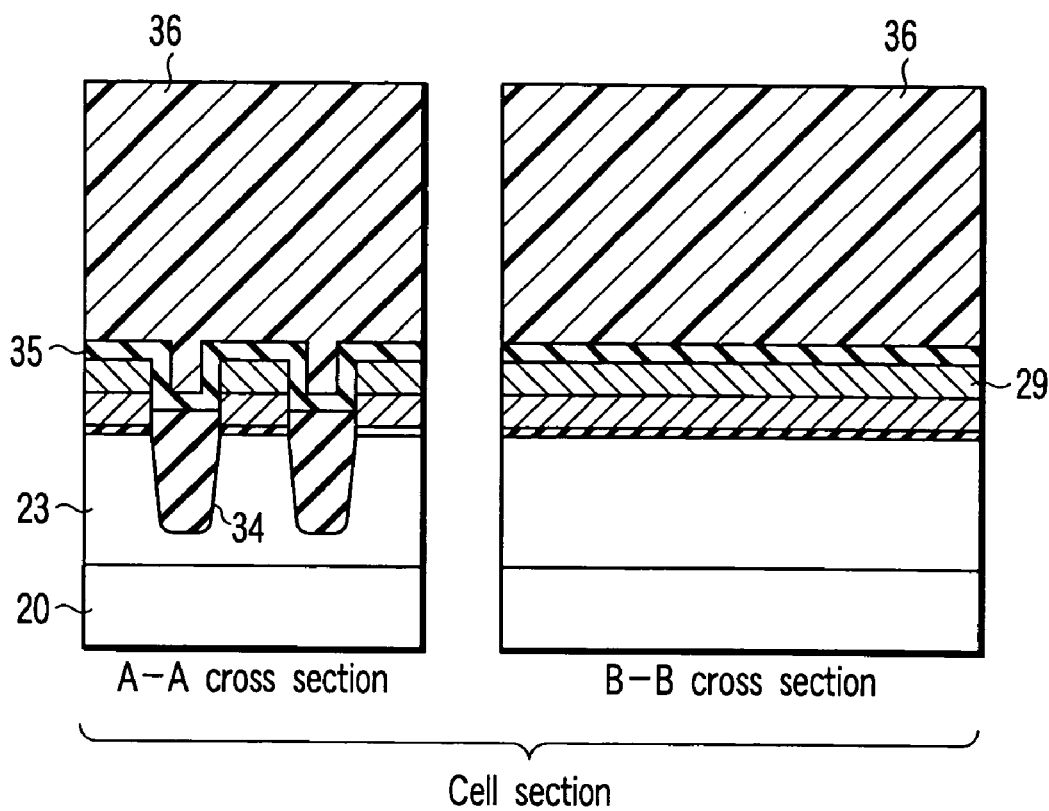
Figure 10B:
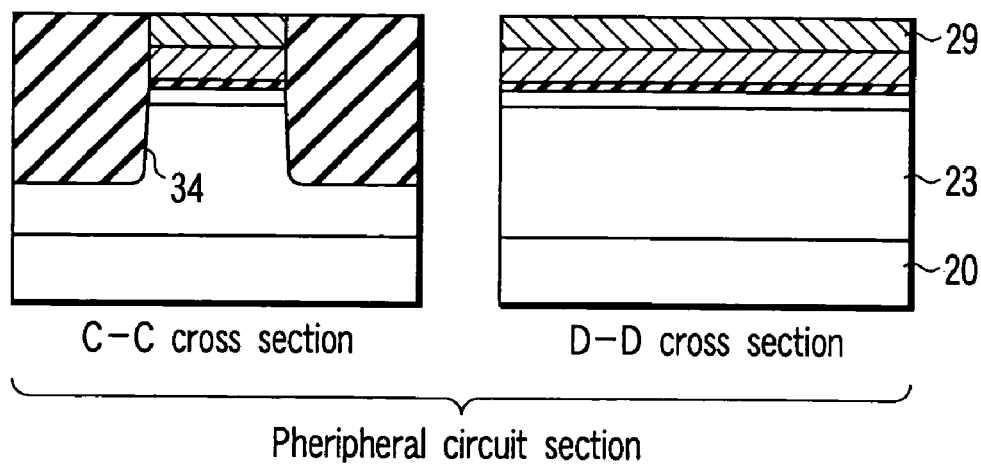

As shown in FIGS. 10A and 10B, a resist pattern 36 is formed on the memory cell section in order to remove the interpoly insulating film 35 on the structure except the memory cell section. The ONO stacked film 35 is removed from the peripheral circuit section by the RIE. The resist pattern 36 is then ashed away.

In this case, the ONO stacked film 35 except the memory cell section is removed. It may be also possible to form a groove in part of the ONO stacked film at the transistor portion of the peripheral circuit section and to be in contact with a subsequently deposited phosphorous-doped polysilicon electrode.

Figure 11A:
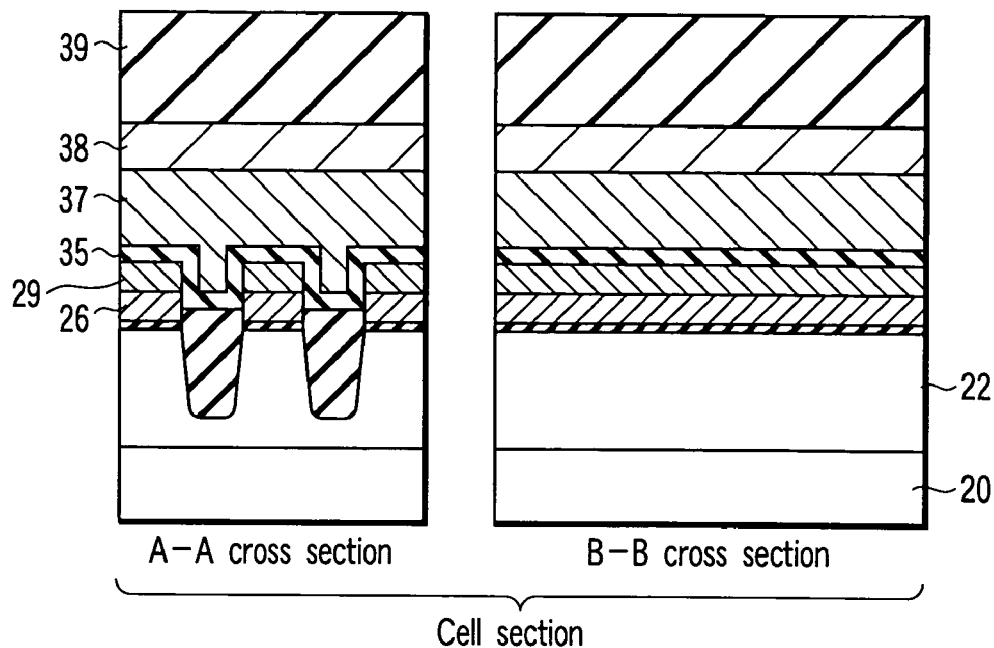
Figure 11B:
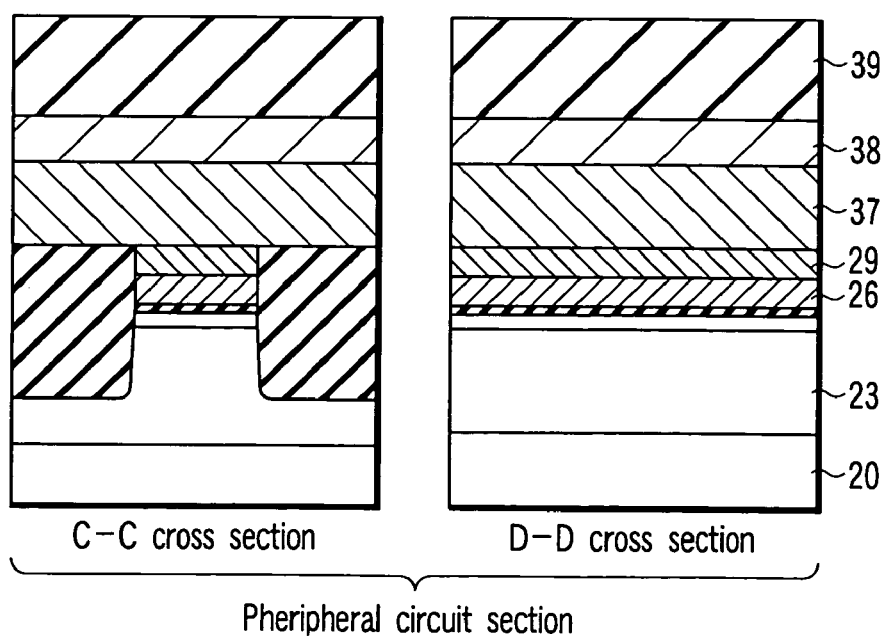

As shown in FIGS. 11A and 11B, a phosphorous-doped polysilicon film 37, WSi film 38, and silicon nitride film 39 are sequentially deposited. The phosphorous-doped polysilicon film 37 and WSi film 38 provide part of the control gate of the memory cell and part of the gate of the MOS transistor in the peripheral circuit section.

Figure 12A:
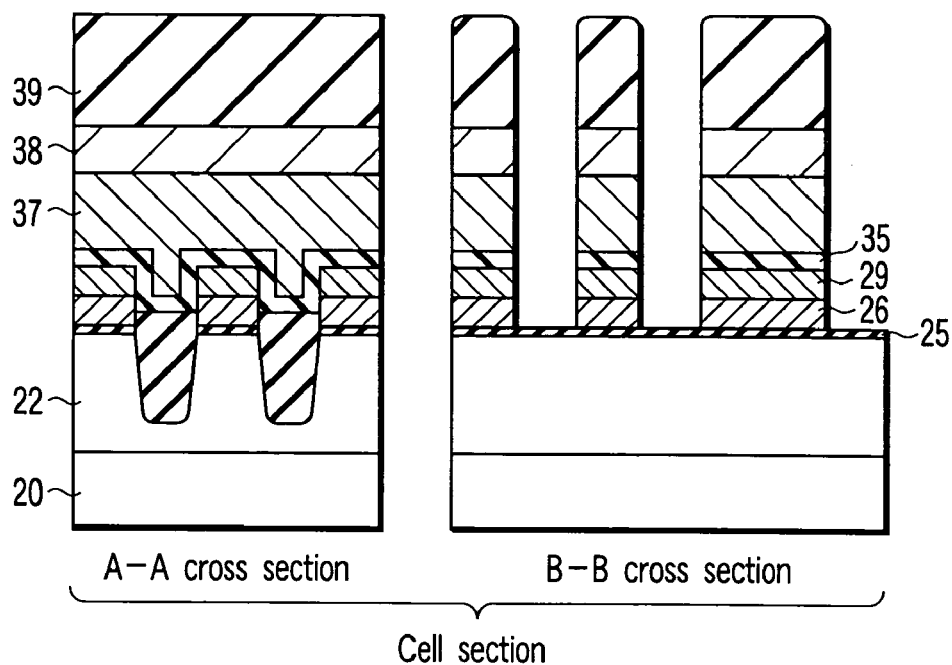
Figure 12B:
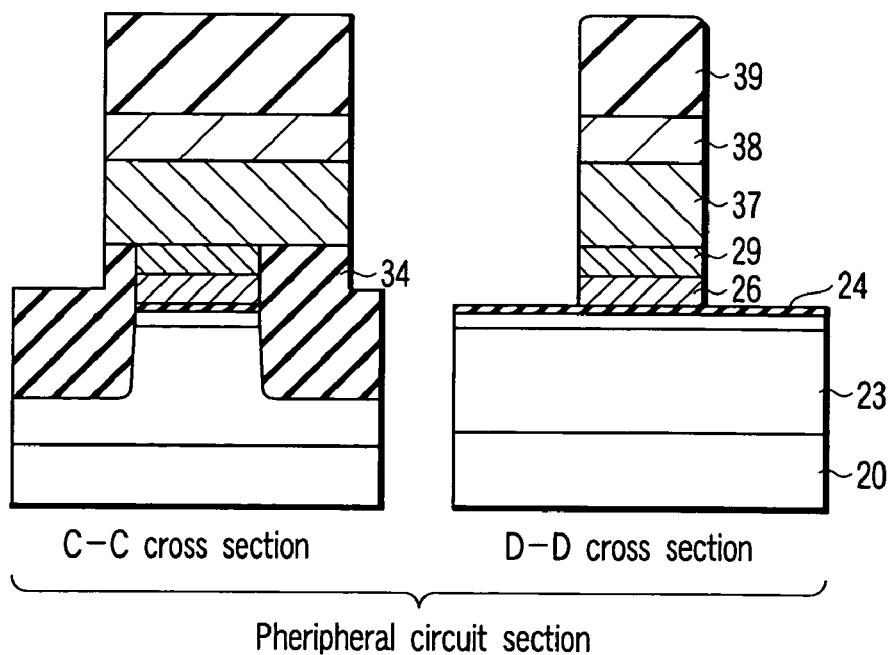

As shown in FIGS. 12A and 12B, a resist (not shown) is applied onto the substrate surface, i.e., the silicon nitride film 39 to form a gate pattern. The silicon nitride film 39, WSi film 38, phosphorous-doped polysilicon film 37, ONO stacked film 35, second polysilicon film 29, and first polysilicon film 26 are sequentially and selectively removed by RIE using the resist pattern as a mask, thereby exposing the tunnel insulting film 25 of the memory cell section and the gate oxide film 24 of the MOS transistor. Thereafter, the resist mask is removed.

Figure 13A:
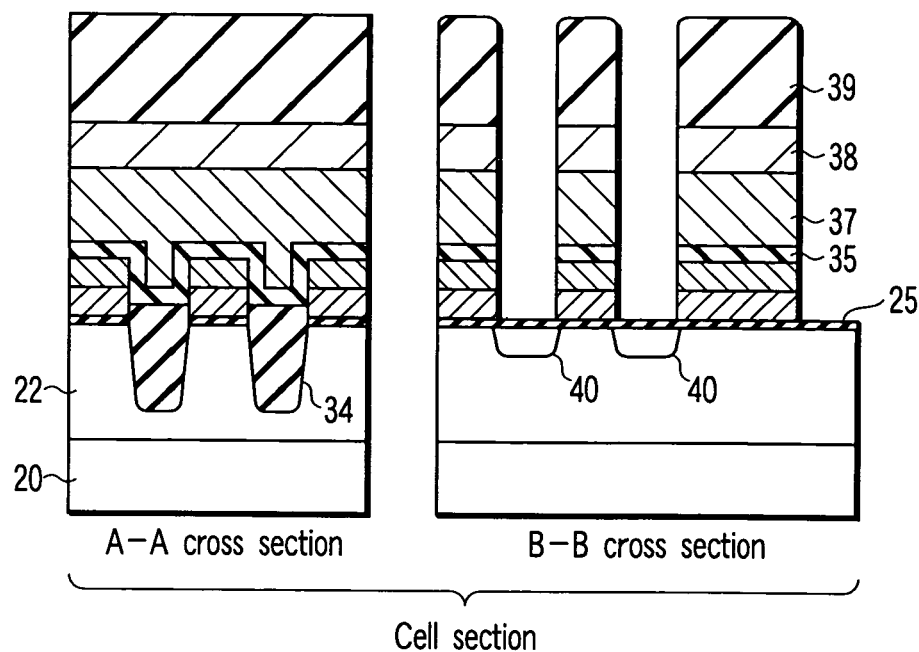
Figure 13B:
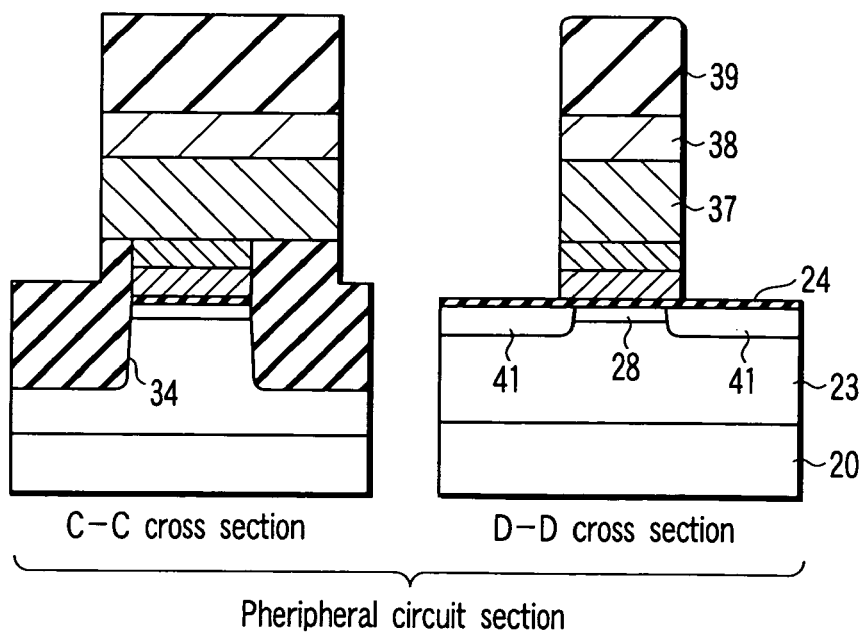

As shown in FIGS. 13A and 13B, source and drain regions 40 for the n-channel memory cell in the memory cell section and source and drain regions 41 for the p-channel MOS transistor in the peripheral circuit section are formed by ion implantation, using a resist mask (not shown) formed on the substrate surface. In this case, a gate side wall (not shown) can also be formed in the oxygen atmosphere.

Figure 14A:
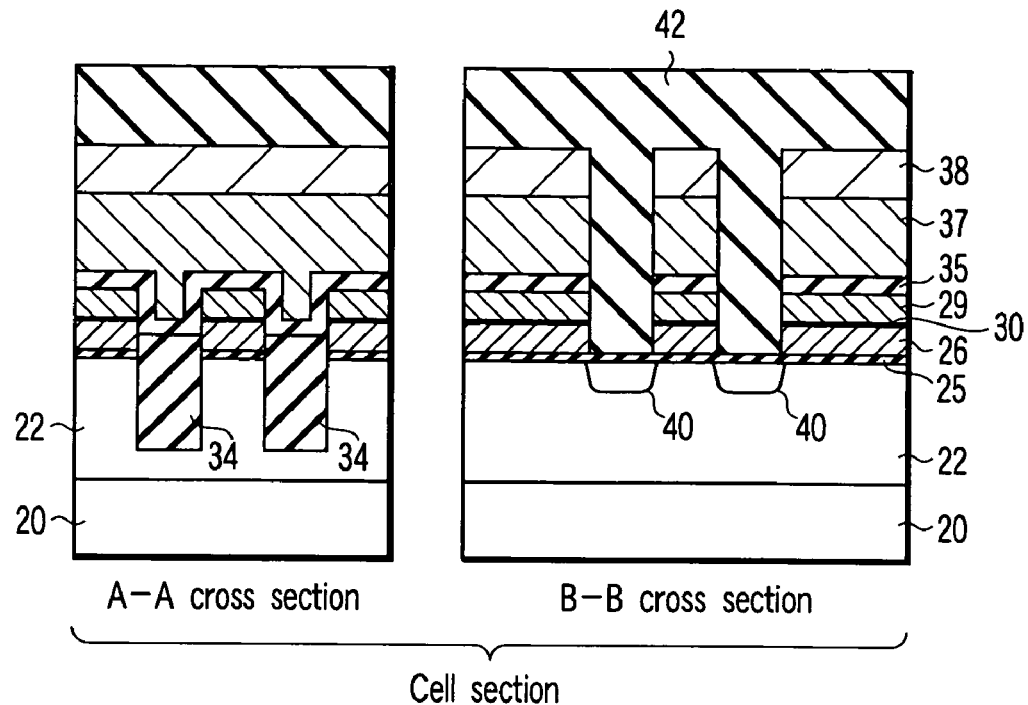
Figure 14B:
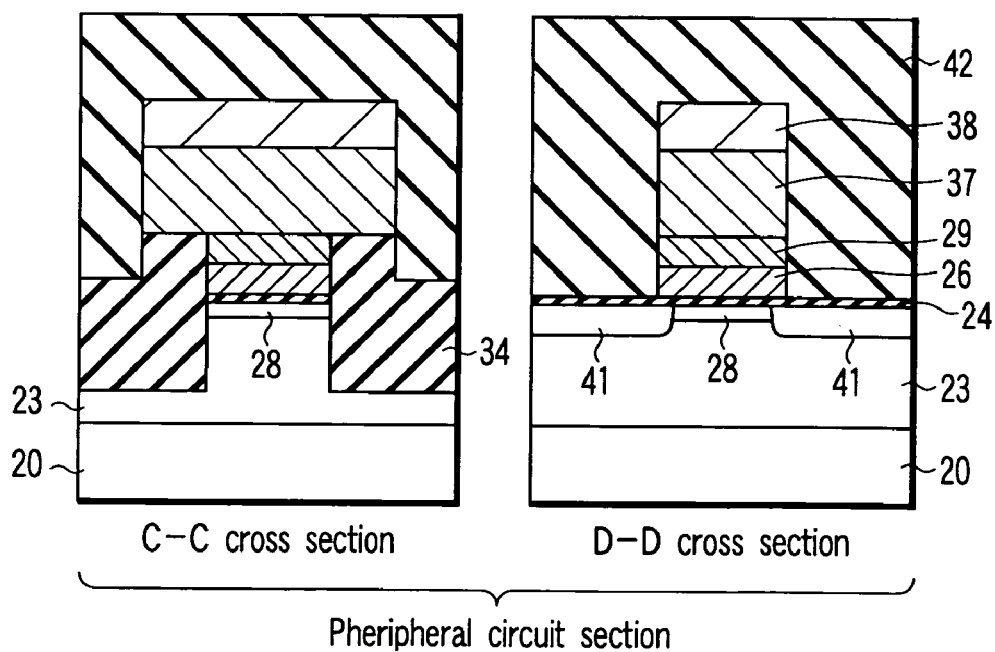

The silicon nitride film 39 is removed from the substrate surface, and the substrate surface is covered with an interlayer insulating film 42. Interconnection layers and contacts (not shown) are generally provided to complete the semiconductor device, as shown in FIGS. 14A and 14B.

According to the present invention, the conventional problems described above can be eliminated to control the channel profile shallowly, and the controllability of the impurity profile can be improved. Therefore, the nonvolatile semiconductor memory device with the fine device structure and its manufacturing method can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device including at least one MOS transistor in a peripheral circuit, comprising:
   a semiconductor substrate;
   an isolation insulating film defining a plurality of element formation regions, the isolation insulating film being buried in an isolation trench provided in the semiconductor substrate;
   a floating gate provided in each of the element formation regions via a first gate insulating film, the floating gate being self-aligned at an isolation end in a direction of a channel width and comprising a plurality of polysilicon films, wherein an oxide film is provided between the plurality of polysilicon films, and an entire side surface of the floating gate facing a side surface of the isolation insulating film is flush with the side surface of the isolation insulating film;
   a control gate provided on the floating gate via a second gate insulating film; and
   source and drain regions provided in the semiconductor substrate in self-alignment with the control gate.

2. The device according to claim 1, wherein the floating gate forms at least part of a gate electrode in the at least one MOS transistor.

3. The device according to claim 1, wherein the peripheral circuit includes at least one high breakdown voltage transistor.

4. The device according to claim 1, wherein a top surface of the isolation insulating film is positioned at a height lower than a height at which a top surface of the floating gate is positioned.

5. The device according to claim 1, wherein the floating gate includes an undoped polysilicon film and a phosphorus-doped polysilicon film.

6. A nonvolatile semiconductor memory device including at least one MOS transistor in a peripheral circuit, comprising:
   a semiconductor substrate;
   an isolation insulating film defining a plurality of element formation regions, the isolation insulating film being buried in an isolation trench provided in the semiconductor substrate;

a floating gate provided in each of the element formation regions via a first gate insulating film, the floating gate being self-aligned at an isolation end in a direction of a channel width and comprising a plurality of polysilicon films, wherein a grain boundary is provided between the plurality of polysilicon films, and an entire side surface of the floating gate facing a side surface of the isolation insulating film is flush with the side surface of the isolation insulating film;

a control gate provided on the floating gate via a second gate insulating film; and source and drain regions provided in the semiconductor substrate in self-alignment with the control gate.

7. The device according to claim 6, wherein the floating gate forms at least part of a gate electrode in the at least one MOS transistor.

8. The device according to claim 6, wherein the peripheral circuit includes at least one high breakdown voltage transistor.

9. The device according to claim 6, wherein a top surface of the isolation insulating film is positioned at a height lower than a height at which a top surface of the floating gate is positioned.

10. The device according to claim 6, wherein the floating gate includes an undoped polysilicon film and a phosphorus-doped polysilicon film.

* * * * *